United States Patent
Bianca et al.

[11] Patent Number: 5,938,996
[45] Date of Patent: Aug. 17, 1999

[54] METHOD FOR MAKING A CONTINUOUS CARRIER FOR ELECTRICAL OR MECHANICAL COMPONENTS

[75] Inventors: Giuseppe Bianca, Temecula; Robert M. Bogursky, Encinitas, both of Calif.

[73] Assignee: Autosplice Systems, Inc., San Diego, Calif.

[21] Appl. No.: 08/794,993

[22] Filed: Feb. 5, 1997

Related U.S. Application Data

[63] Continuation-in-part of application No. 08/584,534, Jan. 11, 1996, Pat. No. 5,706,952.

[51] Int. Cl.⁶ .......................... B29C 39/18; B29C 39/30; B29C 70/76
[52] U.S. Cl. .................. 264/145; 264/252; 264/272.14; 264/272.15
[58] Field of Search .......................... 264/272.11, 272.14, 264/272.15, 272.17, 252, 274, 261, 263, 145, 146; 425/116

[56] References Cited

U.S. PATENT DOCUMENTS

| | | | |
|---|---|---|---|
| 3,672,046 | 6/1972 | Storey, II et al. | 264/272.11 |
| 4,785,527 | 11/1988 | Bernard et al. | 29/605 |
| 4,793,060 | 12/1988 | Pretchel | 29/858 |
| 4,812,421 | 3/1989 | Jung et al. | 29/835 |
| 4,816,426 | 3/1989 | Bridges et al. | 264/272.11 |
| 4,857,483 | 8/1989 | Steffen et al. | 437/209 |
| 5,266,739 | 11/1993 | Yamauchi | 174/52.2 |
| 5,286,426 | 2/1994 | Rano, Jr. et al. | 264/272.17 |

*Primary Examiner*—Angela Ortiz

[57] ABSTRACT

A new continuous carrier for surface mount or other electrical or mechanical parts, and a method of fabricating same, formed by molding one or a pair of continuous flexible film strips to a side or sides of a series of desired electrical or mechanical components such that the components are attached to the single strip or filament or suspended between the film strips or filaments. The film strips may be provided with sprocket holes or other equivalent structure for advancing the film strips during the molding process and for reeling up the resultant assembly onto a reel for sale or distribution to a PCB assembler. The latter places the reel of molded parts onto a conventional feeding device. The parts are then separated from the supporting strips or filament, picked-up by a pick-and-place device and placed onto the PCB in the normal manner. The filament or strip may be constituted of plastic, paper or metal.

12 Claims, 8 Drawing Sheets

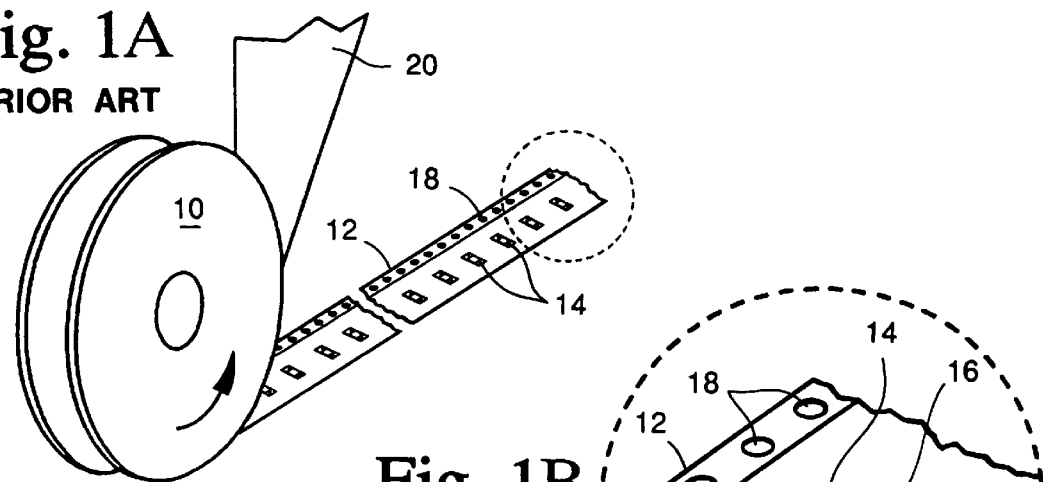
Fig. 1A PRIOR ART
Fig. 1B PRIOR ART
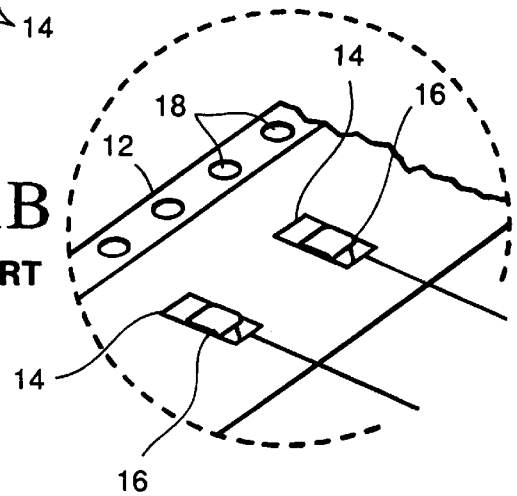
Fig. 5
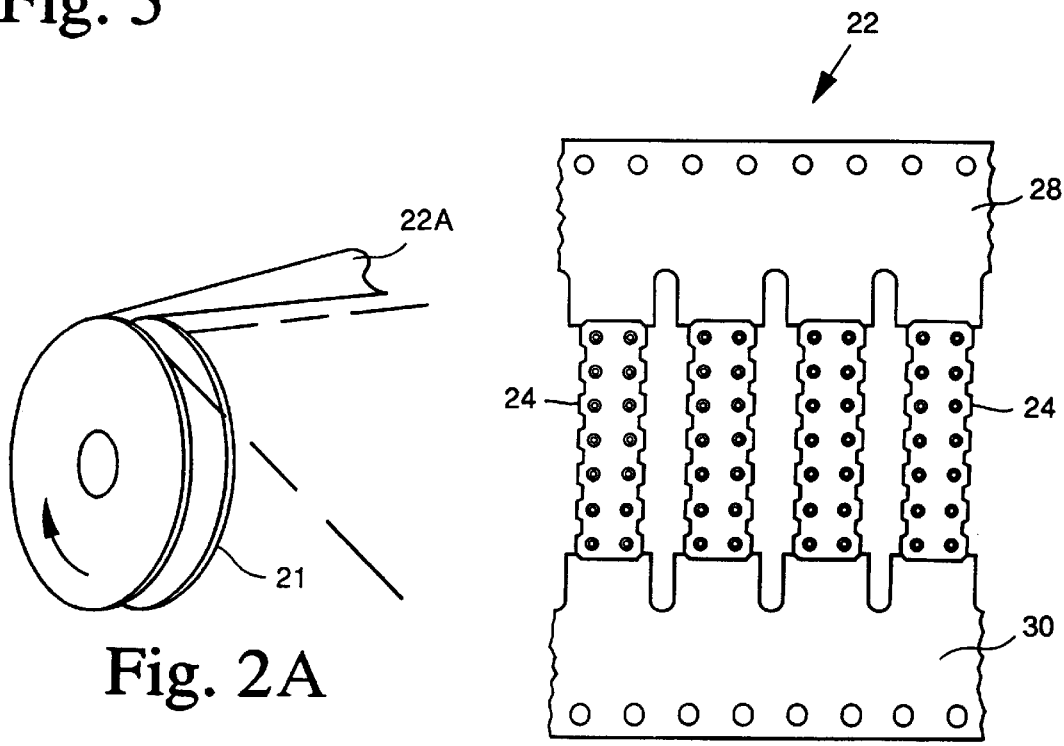
Fig. 2A
Fig. 2B

METHOD FOR MAKING A CONTINUOUS CARRIER FOR ELECTRICAL OR MECHANICAL COMPONENTS

RELATED APPLICATION

This application is a continuation-in-part of U.S. application Ser. No. 08/584,534, filed Jan. 11, 1996, now U.S. Pat. No. 5,706,952.

The invention is directed to a continuous carrier support for carrying electrical or mechanical components for automatic placement on a printed circuit board (PCB) or the like.

BACKGROUND OF INVENTION

Tape and reel supply of electrical parts for automatic pick-and-place by a mechanical or pneumatic device onto a PCB or similar device is well known in the art. See, for example, the description in copending U.S. application Ser. No. 08/084,579. In the conventional system, a plastic carrier tape with sprocket holes along one or both edges is embossed to form a series of pockets into each of which is placed a separately made electrical component. The assembly is then covered with a plastic strip and reeled up on a reel. During assembly of the PCB, the carrier tape is unreeled, the plastic strip removed, and a pick-and-place head is used to contact and pick a surface mount technology (SMT) component out of a carrier pocket and place it in a desired position, usually under control of a computer, on one or more tinned PCB pads. The latter are usually provided with solder paste that acts as a temporary adhesive to hold the SMT part onto the PCB pads during a subsequent solder reflow process which permanently bonds and electrically connects the part to the PCB circuitry via the pads. This system has been successfully used for many years. However, there is a continuous trend toward reducing equipment costs and in particular assembly costs. The conventional embossed carrier tape-assembly process is expensive, and has the further disadvantage that it is not well suited for a mechanical pick-and-place device which has to penetrate into the cavity of the pocket in order to grip the component.

Commonly-owned U.S. Pat. No. 4,832,622 describes the manufacture of a continuous strip of header components by continuous extrusion or by semi-continous injection molding. In both cases, the entire header body of each component is molded of the same plastic material simultaneously with the plastic material that couples the header bodies together. In the case of the semi-continuous molding, the coupling for the header bodies is a spine member that is molded simultaneously with the header bodies and therefore must be of the same material. This scheme which works well suffers from the disadvantage of limited ability to adjust to different conditions. In particular, the scheme described in this patent is not doable for component coupling means that is preformed or constituted of a different material than that of the component body. Moreover, the link between the components and the component coupling means is typically relatively strong, which requires a special cutter to separate each component from its coupling means. Finally, the resultant product, as described, is not suitable for processing by pick-and-place devices using a suction head.

SUMMARY OF INVENTION

The principal object of the invention is a new continuous carrier for electrical or mechanical parts that is less expensive, sufficiently adjustable to accommodate electrical or mechanical components of any shape, size, or configuration, and will work satisfactorily with either or both mechanical and pneumatic types of pick-and-place devices.

Another object of the invention is a new method of fabricating a continuous carrier supporting certain types of electrical parts or mechanical parts, and in particular SMT components.

These and other objects are achieved in accordance with one feature of the invention by molding at least one continuous flexible film strip or filament to a side of each of a series of desired electrical or mechanical components such that the components are supported by the film strip or filament. The molded connection between each of the components and its supporting strip or filament is such that the components are readily separated from its supporting strip or filament in any one of several ways, such as by pushing, pulling or cutting, without damage to it or its neighboring components.

A preferred embodiment of the invention comprises molding opposite sides of a series of desired components to continuous flexible film strips such that the components are suspended between the film strips. The film strips may be provided with sprocket holes or other equivalent structure for advancing the film strips during the molding process and for reeling up the resultant assembly onto a reel for sale or distribution to a PCB assembler. The latter places the reel of molded parts onto a conventional feeding device which can use the same sprocket holes or other equivalent structure for feeding the resultant carrier to, for example, an automatic pick-and-place machine. The parts are then separated from the supporting strips, picked up by a conventional pick-and-place device in the machine and placed onto the PCB in the normal manner.

In this process according to the invention, no embossing step of a plastic carrier is required, no cover strip is needed to keep the parts from falling out of their respective pockets, and no assembly of components into the pockets is needed. The result is that the cost of fabricating packaged parts on a continuous carrier tape for automatic placement on PCBs is greatly reduced. In addition, the supporting strip or filament can be constituted of any material that can be attached to the moldable region of the component while the latter is molded. Another advantage achieved with the invention is that the component parts supported by the carrier strip or filament can be made readily accessible both to the normal suction head of a pneumatic pick-and-place device, as well as the normal gripper of a mechanical pick-and-place device. Still another advantage is that more parts per linear foot of the carrier is possible as the components can be more closely spaced.

A further advantage of the embodiment employing spaced strips on both sides is that any difference in shrinkage between the component molding and the carrier strips is not reflected in any loss in accuracy of any locator means on the strip, such as, for example, drive holes.

The invention is especially useful for the fabrication of component parts that include, as a major constituent, a molded plastic body. Preferably, the film strips or filaments are constituted of a material that is capable of withstanding the elevated temperatures required to injection mold the plastic body of the components. The molded connection of the strips or filament to the plastic component body is achieved, in accordance with another aspect of the invention, by feeding the plastic strips or filament into the injection mold so as to overlie, at least at one side, each mold section, clamping the strip or filament in that position, and then injecting molten plastic to form the molded body and attach or encapsulate the overlying strip or filament edge. The amount of overlap controls the pull-off strength of the components from the strip or filament. Preferably, the overlap is chosen to provide a pull-off force of between about 3–5 pounds per side strip.

The invention is applicable not only to injection molded insulating plastic materials, but also to other similarly formable materials and processes. Typical insulating plastics such as ABS, PPA, polyesters, and polycarbonates can be used to make insulating parts, as well as elastomeric materials. In addition, the parts can be made electrically-conductive by using electrically conductive plastics such as compounding insulating material with stainless steel fibers, carbon fibers or carbon powder. The formable material can also include fibers for reinforcement, such as glass fibers. In addition, the invention is also applicable to the molding of metals, typically low-melting-point metals such as zinc. The process of injection molding of zinc is called die casting, but the process is very similar to the injection molding of plastics in that the zinc is melted and as a fluid is injected under pressure into a die or mold using runners to direct the molten metal into a cavity or cavities, and cores if desired may also be introduced to make more complex shapes. For further information, reference is made to "Product Design For Die Casting", published in 1996 by the Diecasting Development Council, 4th Ed., Ch. 4, Pgs. 97–102, whose contents are herein incorporated by reference. Thus, the terms "molded", "injection-molded", "moldable", or "molding" as used herein should be understood in the broadest sense to include not only injection molding of plastics or other formable materials but also die casting of metals.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

SUMMARY OF THE DRAWINGS

In the drawings:

FIG. 1A shows, schematically, a conventional reel of carrier parts;

FIG. 1B is an enlarged detail view of part of the conventional reel of carrier parts shown in FIG. 1A;

FIG. 2A is a schematic view of a reel according to the invention containing one form of a carrier support in accordance with the invention;

FIG. 2B is a plan view of part of the carrier support on the reel of FIG. 2A;

FIG. 5 is a detail view of the carrier support of FIG. 3 along the line 5—5;

DETAILED DESCRIPTION OF PREFERRED EMBODIMENTS

Figure 2C:
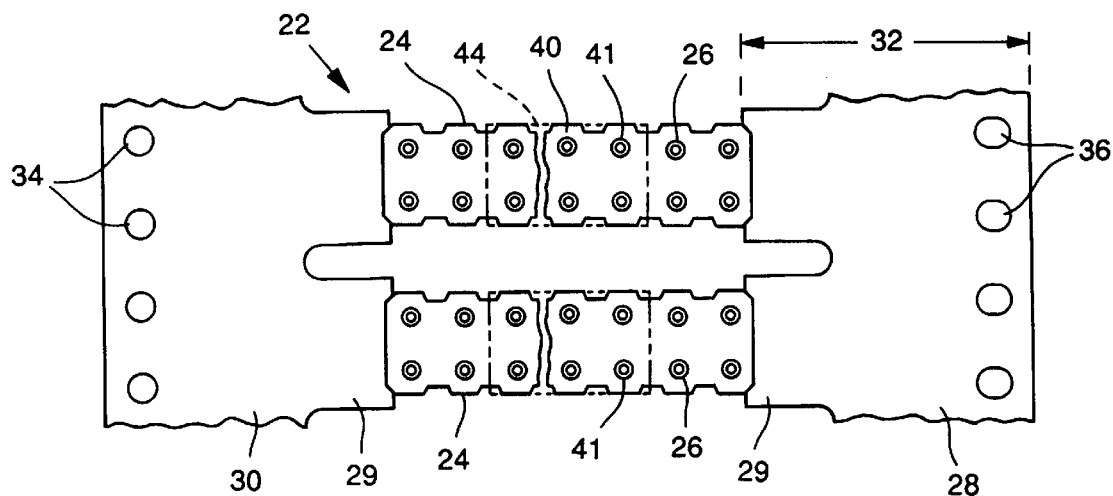
FIG. 2C is an enlarged plan view of the carrier support of FIG. 2B.

FIGS. 1A and 1B are schematic views of a prior art reeled tape of electrical components. The reel 10 has reeled up on it a plastic tape 12 which is embossed to form a series of pockets 14 into each of which is placed a separately fabricated electrical component 16. The tape 12 has a series of sprocket holes 18 along one edge for advancing the tape. After the components 16 have been loaded into the tape pockets 14, a plastic cover strip 20 is sealed over the filled pockets 14 to prevent the components from falling out when the strip is reeled onto or unreeled from the reel 10. As will be observed from FIG. 1B, the components 16 typically have a flat top for receiving the end of a suction head for removing the component from the pocket and placing it on the PCB surface after the cover strip is removed. However, the part 16 is at or below the tape surface, making it difficult to use a mechanical gripper to remove the part, as the gripper would have to be inserted into the pocket 14 to grip the component sides below its exposed top. Moreover, the cost of fabricating the embossed tape and assembling the separately made components 16 to the tape is relatively high.

A principal feature of the invention is to encapsulate or attach one or a pair of carrier strips or filaments directly to a side portion of each of the components while a molded part of the latter is molded. The invention, instead of separately making the electrical components and embossed tape and assembling them, integrates a molding step of the components with attachment of the carrier support to a side portion of each component, hence eliminating the tape embossing step, the assembling step and the attachment of the cover strip step thereby greatly reducing the fabrication cost of a carrier strip loaded with electrical components. In comparison with the scheme described in the referenced commonly-owned patent, the invention allows the use of strips or filaments that are not of the same material as that of the molded component portion, and provides a continuous supply strip of components that allows the components to be readily separated from its supporting strip or filament by simply pulling the component off of its attachment.

FIG. 2A shows a reel 21 according to the invention containing one form of a carrier supply strip 22 according to the invention, and FIG. 2B is an enlarged plan view of part of the carrier strip 22 according to the invention supporting four components 24, in this instance pin headers with two rows of electrically-conductive pins 26. In the enlarged view of FIG. 2C, spaced plastic strips 28, 30 are provided from a reel, having been cut to the desired width and shape indicated in the figure by reference 32. The strip widths do not have to be the same. Along one strip edge is provided a series of round sprocket holes 34, and along the corresponding edge of the other strip is provided a series of oval sprocket holes 36. The round sprocket holes 34 are used to advance the strip in controlled steps by any known indexing device such as a controlled sprocket wheel. The oval holes 36, which are also engaged by a sprocket wheel, are slightly enlarged to accommodate variations and tolerences in the advancing drive.

The electrical components 24 in this embodiment are pin headers, two of which are shown spaced apart in the longitudinal direction of the carrier, and each of which comprises a molded plastic body 40 perforated with two rows of apertures 41 into which are inserted electrical pins 26. Each header encapsulates edge regions 42 (FIG. 6A) along facing edges of the two strips 28, 30 which thus support the components 24 between the strips. The resultant supply strip 22 of edge-supported components 24 can now be wound up on the reel 21 for use by a component feeding device used with a mechanical pick-and-place device for gripping the component by one or more of its upstanding pins after it has been separated from its supporting strips 28, 30 for placement on a PCB. If instead it is desired to use a pneumatic pick-and-place device, which requires a flat top surface for the suction head, a stiff plastic cover 44, shown in phantom, may be detachably assembled to the header 24 to supply the flat top, the cover 44 being removed from the header after the soldering step. FIG. 5 shows that an alignment notch 46 may be molded into the side of each header 24 to aid the feeder and/or pick-and-place device in locating the header.

Figure 8A:
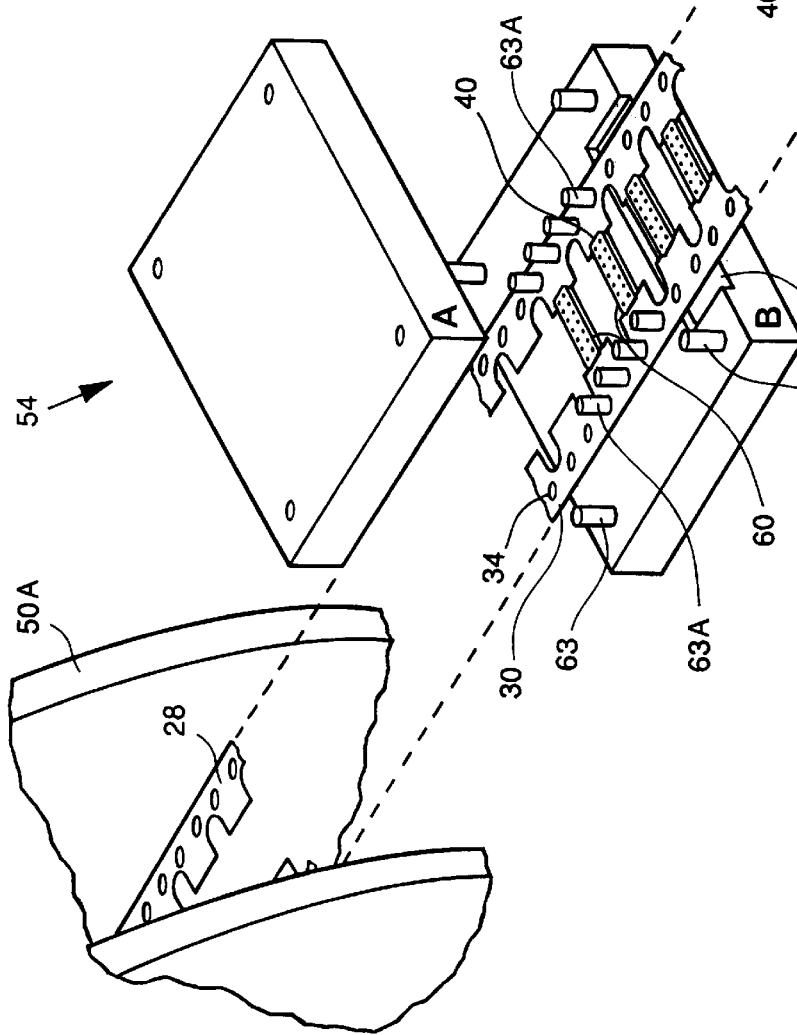
FIG. 8A is a perspective view schematically illustrating how the strips are molded to the molded bodies of component parts inside a mold section.
Figure 8B:
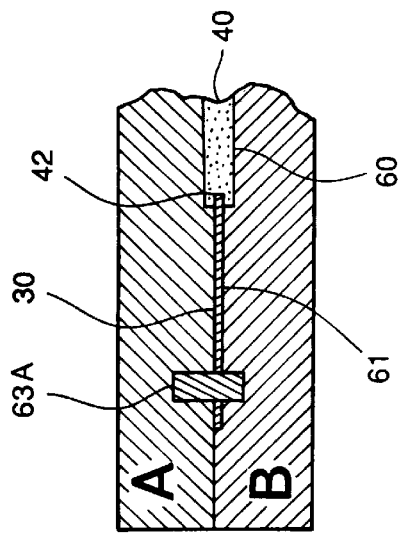
FIG. 8B is a cross-sectional detail view of part of the mold of FIG. 8A.
Figure 9:
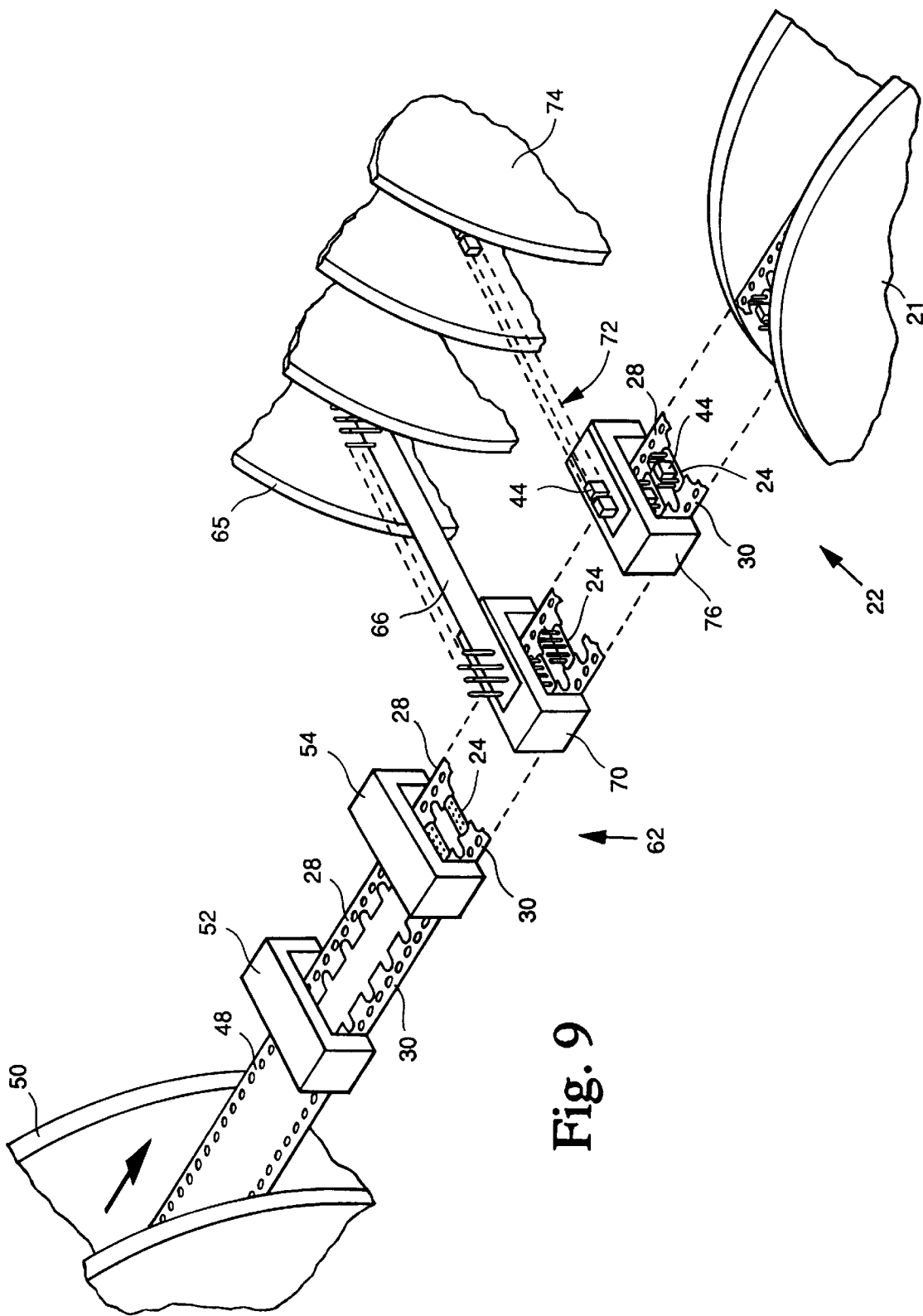
FIG. 9 is a schematic perspective view illustrating the fabrication of a continuous carrier in accordance with the invention.
Figure 10:
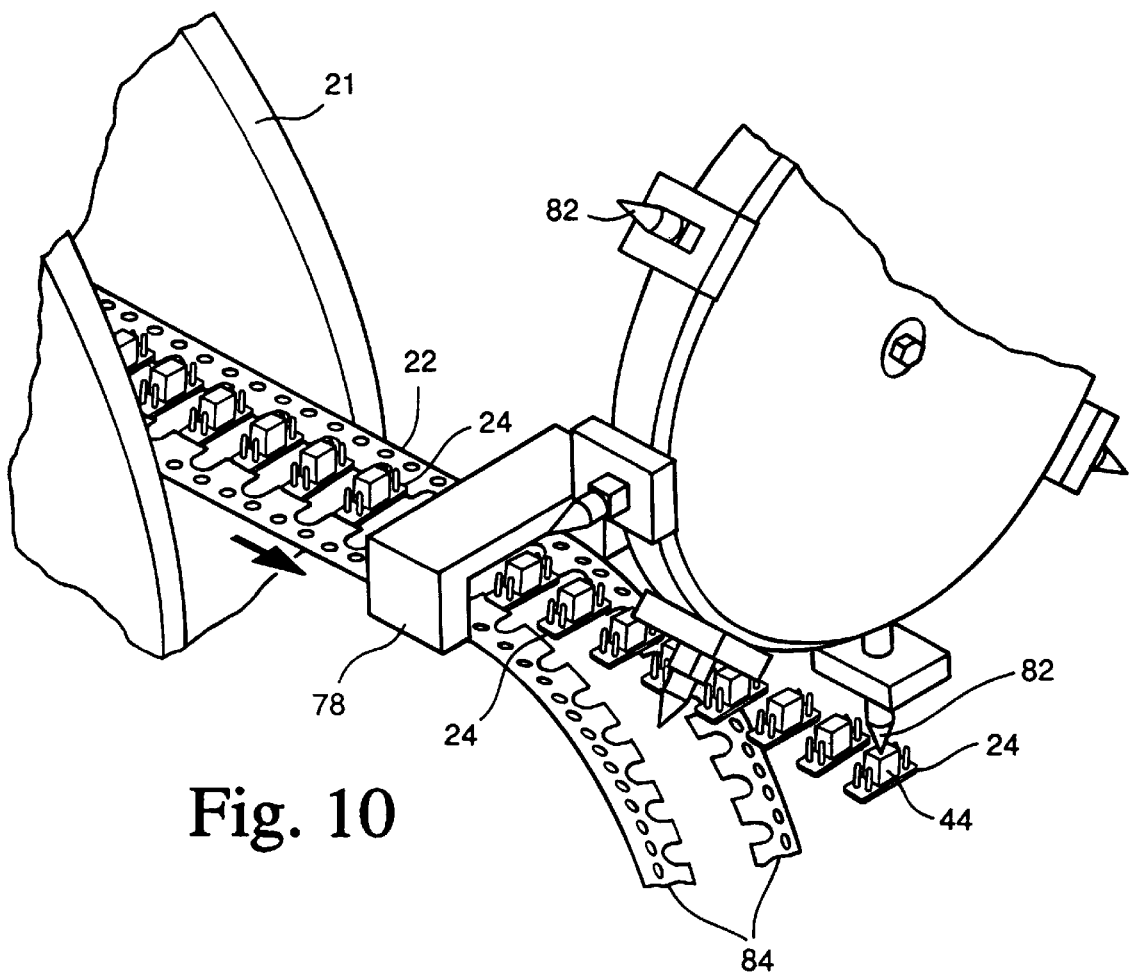
FIG. 10 is a schematic perspective view illustrating how individual components can be separated from the carrier of FIG. 9 and picked up by a conventional pick-and-place system.

FIGS. 8A, 8B and 9 show one way by which the flexible strips 28, 30 can be molded to the header components 24. A strip of plastic 48 pre-stamped with the sprocket holes 34, 36 is supplied from a reel 50 and advanced by any known indexing mechanism, for example, sprocket wheels and a synchronous drive (not shown), through a conventional stamping die 52 which configures and forms the two side strips 28, 30. While FIG. 9 shows a starting strip 48 with the same width as the final product, and with the stamper 52 removing the center strip section to form the two side strips 28, 30, this is not essential. One can start with two pres-tamped narrower strips or with a single narrower strip which is stamped or slit to form the two side strips 28, 30. The latter are then processed 54 to encapsulate the strips 28, 30 into a series of molded components 24. One way of doing this, which is not to be considered limiting, is illustrated in FIGS. 8A and 8B. The strips 28, 30 are indexed over the mold base or lower cavity B of an injection mold, the upper cavity A of which is a mirror image of the lower cavity. The lower cavity contains two mold sections 60, each configured to mold one of the header bodies 40. Each mold section 60 contains along opposite edges recessed regions 61 for receiving a strip (only the recess for the strip 30 is shown). When the upper cavity part A is closed over the lower cavity part B, the strips 28, 30 are clamped between the two mold parts, shown schematically in FIG. 8B. When molten plastic is injected into the closed mold in the usual way, the plastic body 40 of each header is molded, simultaneously encapsulating the edge regions 42 of both of the flexible strips. The apertures 41 in the header body 40 may be simultaneously molded by means of core pins (not shown) in the mold halves, or they can be punched in a subsequent step. Following cooling, the mold halves are opened, and the finished assembly 62 ejected from the mold, while simultaneously the assembly 62 is advanced to provide in the opened mold the next strip sections to be encapsulated into the next set of headers to be molded. The process is repeated until molded headers 40 have been attached to and suspended between the strips 28, 30 over their entire length.

Typically, posts 63 are provided for alignment of the mold halves. In addition, pins 63A are shown in the mold for engagement of the sprocket holes 34 to ensure proper alignment of the strips to the component. The pins 63A are shown enlarged for clarity. A recessed area 63B may be provided downstream of the cavities 60 for receiving the molded assembly 62 to prevent damage when the mold closes. In the schematic of FIG. 9, the processing stage 54 is in line in the multiple stage processing starting from one supply reel 50 and ending at one take-up reel 21. FIG. 8A also illustrates an alternative scheme wherein, following the processing stage 52, the strips are reeled up to form a further supply reel 50A for processing stage 54, following which the strip-body assembly 62 is reeled up on a take-up reel 50B, which then acts as the supply for the next stage 70, and so on. This alternative scheme of reeling and unreeling for one or more stages can also be applied to the other stages. It will also be understood that, while only two mold cavities 60 have been shown for simplicity, more than two cavities can be employed if desired to increase the number of parts per mold cycle.

Figure 6A:
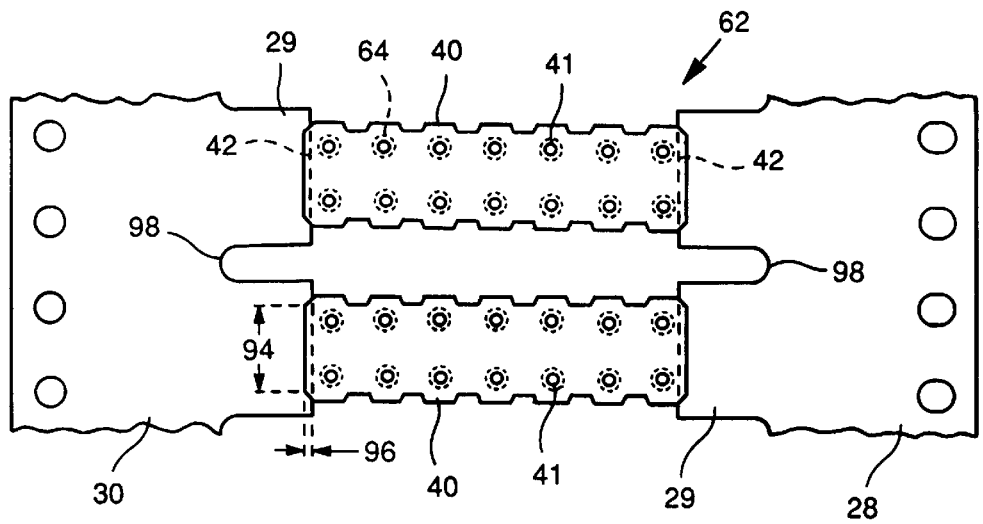
FIGS. 6A and 6B are plan and side views of the carrier support after the molding step but before insertion of the pins.
Figure 6B:
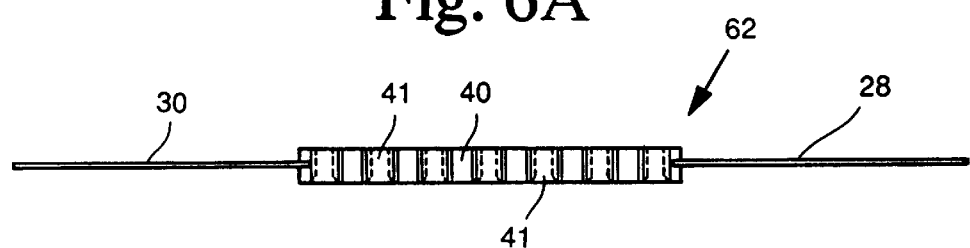
Figure 7A:
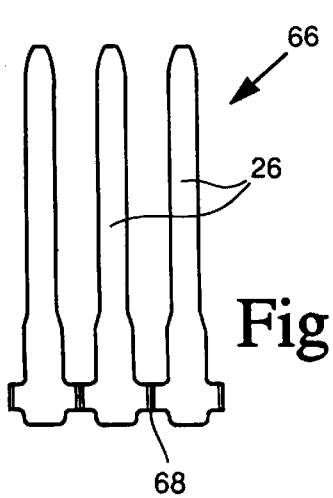
FIGS. 7A, 7B, and 7C are plan, end and side views, respectively, of a strip of pins.
Figure 7B:
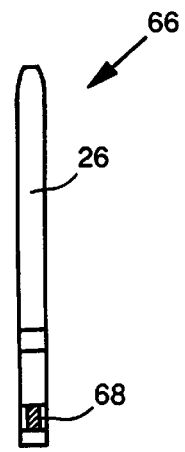
Figure 7C:

Part of the assembly 62 in this intermediate condition following the molding operation is illustrated in FIGS. 6A and 6B for a dual row header containing seven apertures 41 in each row. One of the aperture openings may be bevelled 64 for ease of insertion of the pins 26. The pins 26 can be supplied from a reel 65 as a continuous strip 66 (see FIGS. 7A–7C also) with reduced thickness regions 68 for separation of the pins in a conventional inserter machine 70, illustrated schematically in FIG. 9, which also inserts them into the apertures 40 of the header bodies 40. If desired, a supply 72 of plastic caps 44 from a reel 74 is provided, individual caps 44 separated and attached to the headers 24 in a machine 76, and the modified assembly, which corresponds to the pinned assembly 22 of FIG. 2B, reeled up on a reel 21 typically with interleaf layer 22A for distribution or sale to the PCB fabricator.

At the plant of the fabricator, the carrier 22 is unreeled from the reel 21 and passed through a device 78 which pushes up (by means not shown) on each of the supporting tabs 29 of each of the strips 28, 30 with enough force, while the strips 28, 30 are tightly held, that the component 24 separates from its carrier strips 28, 30 and, while supported, the component can be picked up by a conventional pick-and-place device 80 having a suction head 82 which contacts and vacuum-attaches to the component cover 44. As the carrier 22 advances, a suction head 82 comes into position with each newly-severed component 24 and carries it to the PCB, places the component, and then returns to pick up another component from the carrier 22. The carrier strip residues 84, together with the usual paper interleaf 22A, are guided to a separate accumulation area for disposal.

Figure 3:
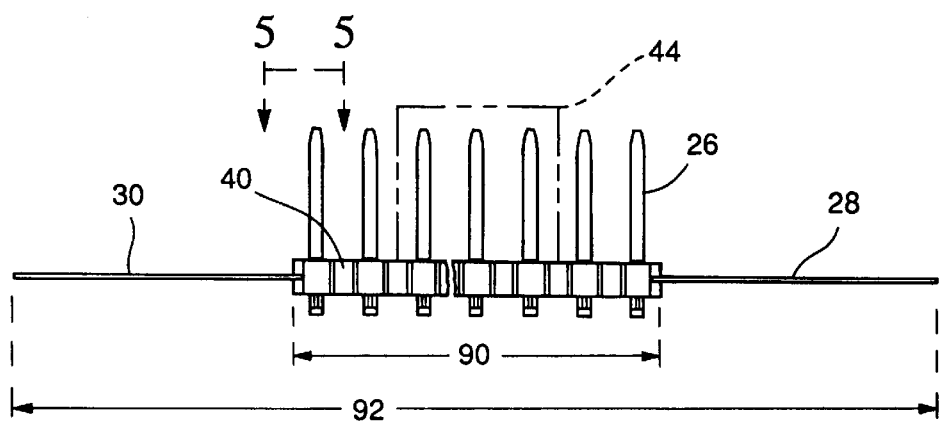
FIG. 3 is a side view of the carrier support of FIG. 2C.
Figure 4:
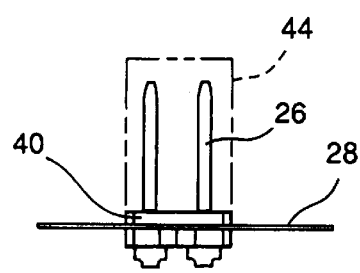
FIG. 4 is an end view of the carrier support of FIG. 3.

A feature of the invention is that electrical or mechanical components of most any size, shape or configuration can be accommodated on the flexible strips, provided that they include along their sides a moldable region, by which is meant a region that is fabricated by molding of a plastic resin, or as indicated above, another moldable plastic or die-cast metal material, and that will attach to the edges 42 of the plastic strips 28, 30. In the case of the header components 24 having plastic bodies 40, they can be made with one, two, or more rows containing anywhere from 2–22 or more pins per row. To realize this merely requires altering the width of each header, represented in FIG. 3 by the dimension 90, and altering the overall width of the assembly, represented in FIG. 3 by the dimension 92. For the examples given, the dimension 90 can vary between 0.190–2.190 inches, and the dimension 92 can vary between 1.260–2.835 inches for typical pin spacings of 0.100 inches. These numbers are merely exemplary and are not to be considered limiting.

The amount of the overlap of the edge regions 42 of the flexible strips 28, 30 with the mold sections, and thus the degree of encapsulation or attachment, controls the amount of pull-off force needed to separate each component 24 from its supporting strips. The pull-off force should be at least a minimum amount, to ensure that the electrical components 24 do not detach from their carrier during reeling and unreeling and normal handling before being deliberately separated at a time just before being picked-up by the pick-and-place device 82. Similarly, the pull-off force should not exceed a maximum amount, to ensure that any convenient separator force or separating device can be used to reliably separate a component from its carrier strips 28,30 without causing damage to the separated component or the components that remain behind. Experience has shown that, for the component examples given above, a pull-off force of about 3–5 pounds per side is adequate to satisfy both requirements. This pull-off force is achieved by a molded region 42 having a length indicated by 94 in FIG. 6A, for components of the size indicated above, preferably of about 0.2 inches, and an overlap indicated by 96 preferably of about 0.015–0.020 inches. Smaller components may use a smaller overlap, and larger components can use a larger overlap. In this regard, it is useful to provide separating notches 98 in both strips 28, 30 between the component supports. The notches 98 act to weaken the strip at the region of the notches and thus isolate adjacent components and prevent separating forces applied to one component from being transmitted to and damaging adjacent components. Alternatively, the weakened strip regions can be supplied by a series of perforations.

Figure 11:
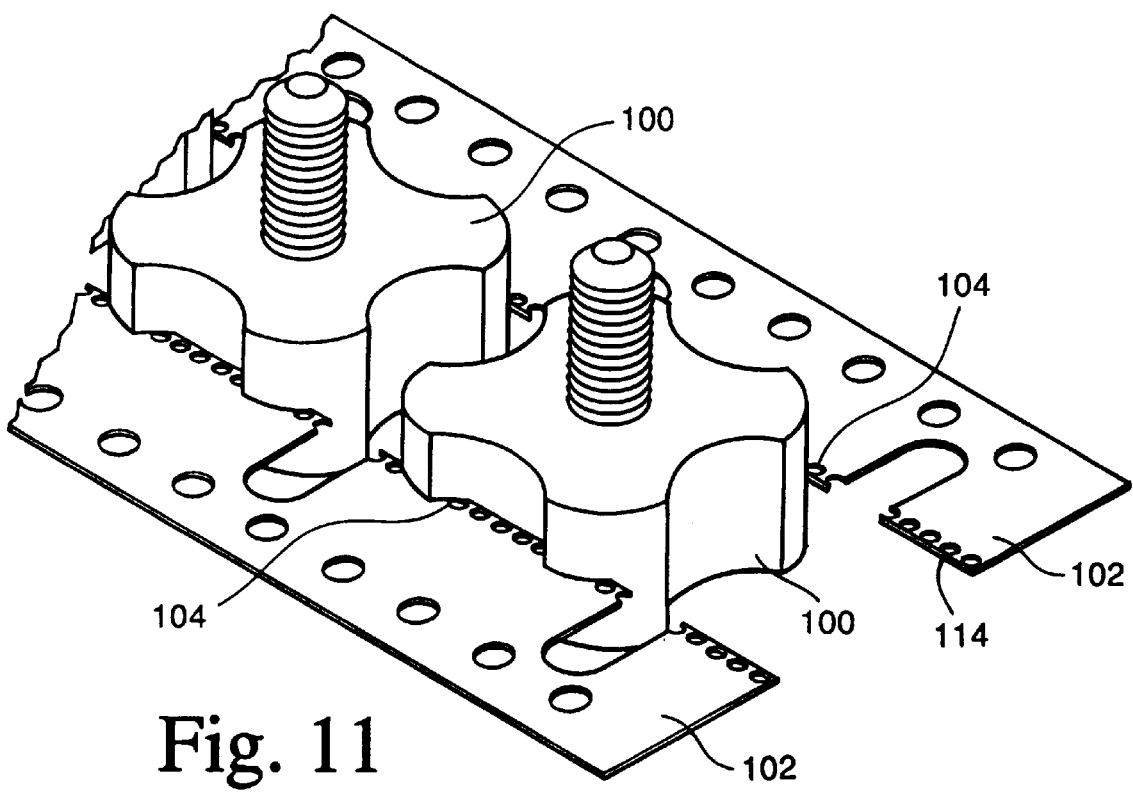
FIG. 11 is a perspective view of part of another series of strip-supported mechanical components, also showing one way of increasing the holding power of the strips.

The invention is obviously not limited to pin header components and can be applied to any type of electrical or mechanical component part that have moldable side regions that can be molded to the flexible strips. Examples of other components are SMT jumpers or switches with plastic housings, plastic headers with sockets, and various mechanical components with plastic body parts or with die-cast metal parts. As a further example, FIG. 11 shows a plastic part with a screw top 100 mounted between a pair of carrier strips 102 with opposite side regions of the plastic part 100 molded to the adjacent edges 104 of the carrier strips.

Preferably, the flexible strips 28, 30 are constituted of a high temperature plastic, such as polyesters commonly known as "Mylar". The high temperature property is desirable as the strip edges will be subjected to the elevated temperature of the injected molten plastic or metal used for molding the components and encapsulating the strips. A molding plastic should similarly be able to withstand the elevated temperatures of the standard SMT reflow or wave-soldering process that the PCB will be subject to. Molding plastics with this property are well known in the art and are available commercially from suppliers such as GE and DuPont. These and other plastics will be obvious to those skilled in this art.

While, in the preferred embodiment, the strips are provided with built in advancing means in the form of the sprocket holes, this is not essential. The downstream end of a strip can be attached to a take-up reel or other pulling device for advancing the strip or filament. Alternatively, the edges of the strip or filament can be engaged by friction drive means for advancing purposes.

Figure 12:
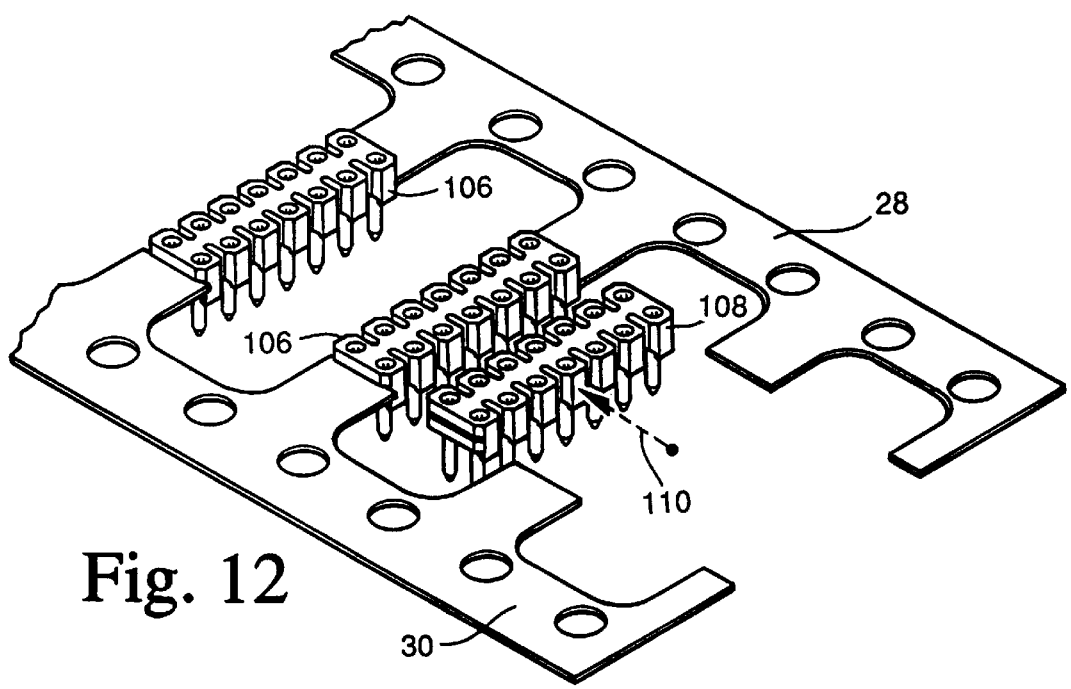
FIG. 12 is a perspective view of part of another series of strip-supported components, also showing another way of separating a component from the strips.

The invention is not limited to a pair of strips connected to opposite side regions of each component so that the components are suspended between the strips. With small components that are light in weight, one side support alone is sufficient to support a series of such components, for example, a small header with only 1 or 2 positions. Also, in the example so far given, the component is separated from the pair of supporting strips by an upward pushing force, which will tear the strip material at the component body, or pull out the strip material from the component body. This is not essential. With a one-carrier strip support, the component can be pulled laterally with respect to the longitudinal direction of the carrier to detach it from the carrier. Alternatively, the component at the leading edge of the strip can be pulled off frontwards with a force in the the longitudinal direction of the carrier to detach it from the carrier. While pulling or pushing on the carrier to detach the component from the carrier is preferred, depending upon the component size and the strength of the carrier, the component can also be separated from its carrier supports by pulling or pushing on the component or by severing it from its carrier supports. In any case, no harm results if part of the carrier strip is left in place in the detached component and protrudes from the component side. FIG. 12 illustrates header assemblies 106 supported by carrier strips 28, 30, with the leading assembly 108 separated from the strips by a force 110 exerted in the longitudinal direction of the strips. As a further alternative, with shorter components but the same carrier width, it is possible to use tabs 29 of the same length and with the molding extended from the component sides by thin tabs which are molded and attached to the strip tabs 29. In this case, cutting of the molded component tabs instead of the strip tabs would be preferred.

Figure 13:
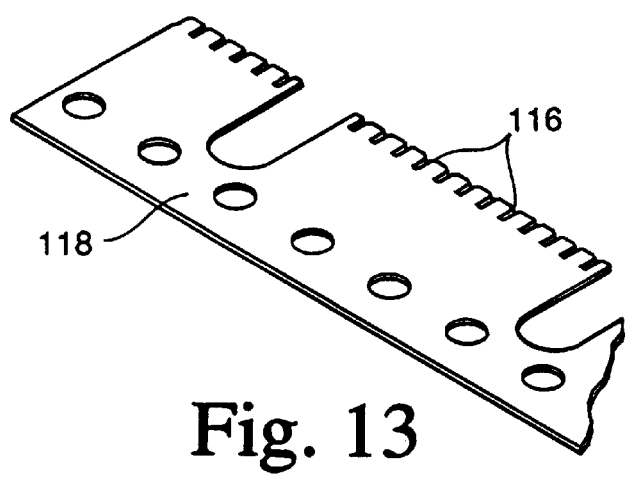
FIG. 13 shows another form of structure for increasing the holding power of a strip.

From a different aspect, if the attachment between the strip or filament and the moldable edge of the component is too weak, the attachment can be enhanced by adding holding structure to the strip edge. For example, as illustrated in FIG. 11, holes 114 can be punched into the strip edge region to be encapsulated. During the molding process, plastic or other moldable material fills the hole and reinforces the strength of the attachment of the component side to the carrier strip. FIG. 13 shows a modification for the holding structure using small slits 116 in the strip 118 to increase the holding power to the component. This may be desirable when the components are supported by only one side strip 118 or filament. Other holding structure can also be substituted, such as dimples or rough edges or other means to increase the holding surface area.

Figure 14:
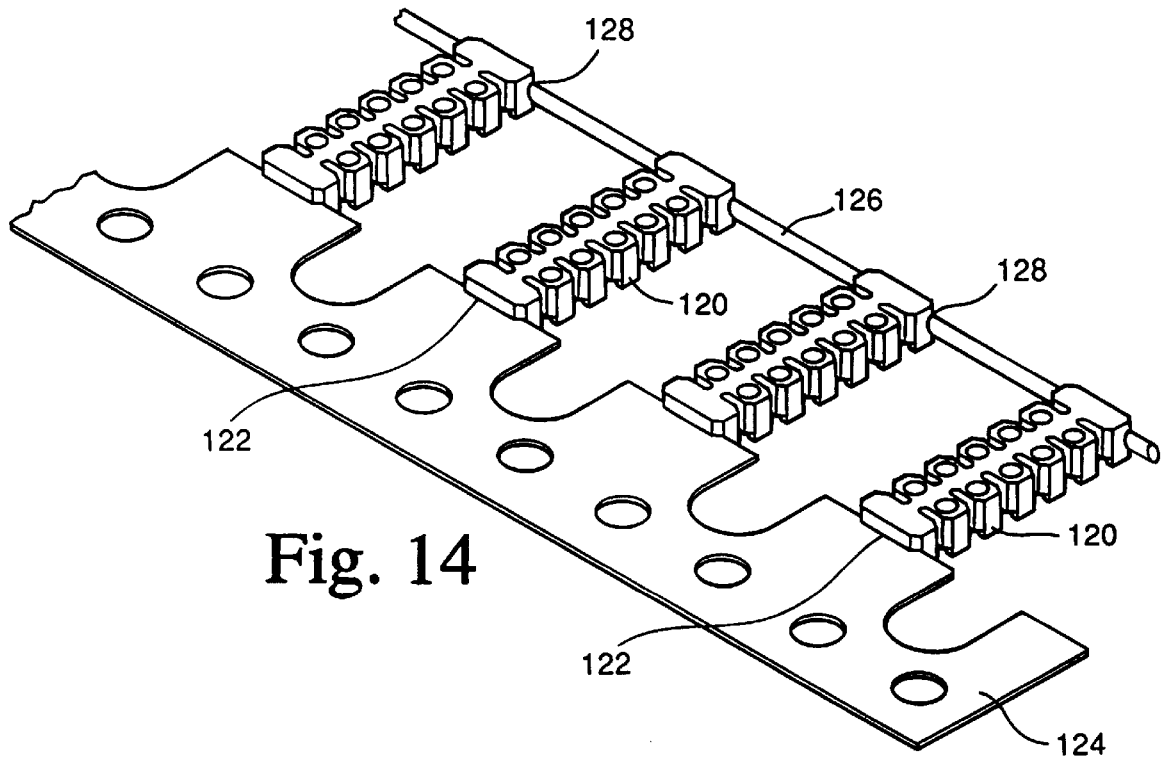
FIG. 14 is a perspective view of part of another series of carrier-supported components using both a strip and a monofilament.
Figure 15:
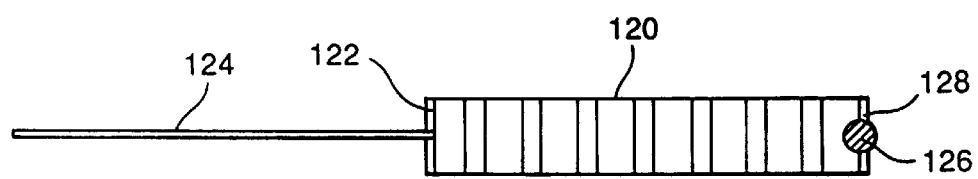
FIG. 15 is an end view of the carrier of FIG. 14.

In the preferred embodiment, a pair of flexible plastic strips serve as the carrier for the series of components. While preferred, this is not essential. The carrier can also be constituted of a single flexible plastic strip attached along one side of each component or of a single or pairs of flexible paper strips or metal strips that will attach to plastic. For example, copper or aluminum foil strips, for example, 0.003–0.005 inches in thickness, are flexible and can be attached by molding to most plastics and can be substituted for the plastic strips. Also, the invention is not limited to strips and can also be implemented by a single flexible filament or pair of filaments, of plastic or metal, which is attached by molding to a side, or encapsulated by molding in the side, of the molded region of a component. A weakened region for easy separation of the component from its supporting filament can be provided by reduced thickness regions in the filament just above and below where it attaches to each component. This is illustrated in FIGS. 14 and 15, which shows a series of pinless headers 120 each supported at molded side regions 122 by a strip 124 of plastic, metal or fiber on one side, and by a monofilament 126 of plastic or metal molded into the opposite side region 128.

As before, when assembled, the resultant supply strip of carrier-supported components can be reeled up on a reel for distribution or sale. A feature of the invention is that a large number of components supported as described above can be supplied to the PCB fabricators for handling with the same kind of reel-supplied equipment that is presently in wide use. Hence, typically such a reel according to the invention will comprise at least six feet of a supply strip of components, which depending on component size can amount to hundreds of components supplied via a single reel.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method of fabricating a continuous carrier strip of electrical or mechanical components, comprising:
   a) providing at least one, continuous, flexible filament or flexible strip, the flexible filament or strip being separate from component bodies to be added in a later step,
   b) providing a mold with sections for the component bodies, said mold having along a side a region for receiving the flexible filament or strip such that their edge overlaps an edge of the mold sections,
   c) clamping with the mold portions of the flexible filament or strip such that a side region overlaps an edge of the mold sections,
   d) thereafter injecting a moldable material into the mold to form at least part of the component bodies molded to and encapsulating an edge region of the flexible filament or strip into part of the just-formed component bodies,
   e) removing the molded component bodies with encapsulated filament or strip from the mold and advancing the flexible filament or strip until next following portions of the moldable filament or strip are in position to be clamped to the mold,
   f) repeating steps c), d) and e) at least once to form a series of spaced component bodies molded along a side to and detachably attached to an edge region of the flexible filament or strip to form a continuous carrier strip containing a plurality of the component bodies,
   g) the molded connection between the moldable edge of the component bodies and the attached region of the filament or edge region of the flexible strip being such that individual component bodies will remain attached to the filament or strip during normal handling of the filament- or strip-supported component bodies but the component bodies can be separated from the filament or strip by an applied separating action without damaging adjacent component bodies.

2. A method of fabricating a continuous carrier strip of electrical or mechanical components as claimed in claim 1, wherein the separating action is a pulling or pushing force.

3. A method of fabricating a continuous carrier strip of electrical or mechanical components as claimed in claim 1, wherein the separating action is a cutting action.

4. A method of fabricating a continuous carrier strip of electrical or mechanical components as claimed in claim 1, wherein the moldable material is a die-castable metal.

5. A method of fabricating a continuous carrier strip of electrical or mechanical components, comprising:
   a) providing a pair of pre-formed spaced, parallel, continuous and separated flexible strips having along at least one edge structure for advancing the strips,
   b) providing a mold with sections for electrical or mechanical component bodies, said mold having along opposite sides regions for receiving the flexible strips such that their inside facing edges overlap opposite edges of the mold sections,
   c) clamping with the mold portions of the flexible spaced strips such that inside edge regions overlap opposite edges of the mold sections,
   d) thereafter injecting plastic or metal into the mold to form at least part of the electrical or mechanical component bodies molded to and encapsulating the edge regions of the spaced strips,
   e) removing the molded component bodies with encapsulated strips from the mold and advancing the flexible strips until next following portions of the moldable strips are in position to be clamped to the mold,
   f) repeating steps c), d) and e) at least once to form a series of spaced electrical or mechanical component bodies molded to and detachably suspended between inside facing edge regions of the flexible strips to form a continuous carrier strip containing a plurality of the electrical or mechanical component bodies,
   g) the molded connection between the moldable edges of the electrical or mechanical component bodies and the facing edge regions of the flexible strips being such that individual electrical or mechanical component bodies will remain attached to the strips during normal handling of the strip-supported component bodies but the component bodies can be separated from the strips by an applied separating force.

6. The method of claim 5, wherein the flexible strips are of a polyester plastic that is different from the plastic or metal used to mold part of the component bodies.

7. The method according to claim 5, wherein the components are electrical components that are plastic headers.

8. The method according to claim 5, wherein, following step g), reeling the continuous carrier strip onto a reel.

9. The method according to claim 5, wherein the material injected is metal in a die-casting process.

10. A method of fabricating a continuous carrier strip of electrical components that are plastic headers, comprising:
   a) providing a pair of spaced, parallel, continuous, flexible strips having along at least one edge structure for advancing the strips,
   b) providing a mold with sections for the electrical components, said mold having along opposite sides regions for receiving the flexible strips such that their inside facing edges overlap opposite edges of the mold sections,
   c) clamping with the mold portions of the flexible spaced strips such that inside edge regions overlap opposite edges of the mold sections,
   d) injecting plastic or metal into the mold to form at least part of the electrical components molded to and encapsulating the edge regions of the spaced strips, e) removing the molded components with encapsulated strips from the mold and advancing the flexible strips until next following portions of the moldable strips are in position to be clamped to the mold, f) repeating steps c), d) and e) at least once to form a series of spaced electrical components molded to and detachably suspended between inside facing edge regions of the flexible strips to form a continuous carrier strip containing a plurality of the electrical components, said electrical components comprising plastic headers, g) inserting spaced electrical pins into the plastic headers, h) the molded connection between the moldable edges of the electrical components and the facing edge regions of the flexible strips being such that individual electrical components will remain attached to the strips during normal handling of the strip-supported components but the components can be separated from the strips by an applied separating force.

11. A method of fabricating a continuous carrier strip of electrical or mechanical components, comprising:

a) providing a pair of spaced, parallel, continuous, flexible strips having along at least one edge structure for advancing the strips, b) providing a mold with sections for electrical or mechanical component bodies, said mold having along opposite sides regions for receiving the flexible strips such that their inside facing edges overlap opposite edges of the mold sections, c) clamping with the mold portions of the flexible spaced strips such that inside edge regions overlap opposite edges of the mold sections, d) injecting zinc metal in a die-casting process into the mold to form at least part of the electrical or mechanical component bodies molded to and encapsulating the edge regions of the spaced strips, e) removing the molded component bodies with encapsulated strips from the mold and advancing the flexible strips until next following portions of the moldable strips are in position to be clamped to the mold, f) repeating steps c), d) and e) at least once to form a series of spaced electrical or mechanical component bodies molded to and detachably suspended between inside facing edge regions of the flexible strips to form a continuous carrier strip containing a plurality of the electrical or mechanical component bodies, g) the molded connection between the moldable edges of the electrical or mechanical component bodies and the facing edge regions of the flexible strips being such that individual electrical or mechanical component bodies will remain attached to the strips during normal handling of the strip-supported component bodies but the component bodies can be separated from the strips by an applied separating force.

12. The method of claim 1, wherein the flexible filament or strip is of a different material than the moldable material used to mold part of the component bodies.

* * * * *